(12) United States Patent
Wells et al.

(10) Patent No.: US 10,608,048 B2
(45) Date of Patent: *Mar. 31, 2020

(54) SELECT DEVICE FOR MEMORY CELL APPLICATIONS

(71) Applicant: Micron Technology, Inc., Boise, ID (US)

(72) Inventors: David H. Wells, Boise, ID (US); Christopher D. Cardon, Boise, ID (US); Caner Onal, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/123,073

(22) Filed: Sep. 6, 2018

(65) Prior Publication Data

US 2019/0006420 A1 Jan. 3, 2019

Related U.S. Application Data

(60) Continuation of application No. 15/665,577, filed on Aug. 1, 2017, now Pat. No. 10,109,677, which is a
(Continued)

(51) Int. Cl.
*G11C 11/00* (2006.01)
*H01L 27/24* (2006.01)
(Continued)

(52) U.S. Cl.
CPC ........ *H01L 27/2427* (2013.01); *G11C 13/003* (2013.01); *G11C 13/004* (2013.01);
(Continued)

(58) Field of Classification Search
CPC .................................................. G11C 13/0002
(Continued)

(56) References Cited

U.S. PATENT DOCUMENTS 6,808,799 B2 10/2004 Darolia et al.
6,891,747 B2 5/2005 Bez et al.
(Continued)

FOREIGN PATENT DOCUMENTS

CN 1506972 A 6/2004
JP 2007158325 A 6/2007
(Continued)

OTHER PUBLICATIONS

Notice of Rejection from related Japanese patent application No. 2017-519688, dated Jul. 24, 2018, 10 pp.
(Continued)

*Primary Examiner* — Hoai V Ho
(74) *Attorney, Agent, or Firm* — Brooks, Cameron & Huebsch, PLLC

(57) ABSTRACT

The present disclosure includes select devices and methods of using select device for memory cell applications. An example select device includes a first electrode having a particular geometry, a semiconductor material formed on the first electrode and a second electrode having the particular geometry with formed on the semiconductor material, wherein the select device is configured to snap between resistive states in response to signals that are applied to the select device.

20 Claims, 3 Drawing Sheets

Related U.S. Application Data continuation of application No. 15/215,659, filed on Jul. 21, 2016, now Pat. No. 9,735,200, which is a division of application No. 14/515,998, filed on Oct. 16, 2014, now Pat. No. 9,425,390.

(51) Int. Cl.
| | | |
|---|---|---|
| *H01L 45/00* | (2006.01) | |
| *H01L 27/22* | (2006.01) | |
| *G11C 13/00* | (2006.01) | |

(52) U.S. Cl.
CPC ...... *G11C 13/0007* (2013.01); *G11C 13/0021* (2013.01); *G11C 13/0064* (2013.01); *G11C 13/0069* (2013.01); *H01L 27/224* (2013.01); *H01L 27/2409* (2013.01); *H01L 27/2463* (2013.01); *H01L 45/04* (2013.01); *H01L 45/06* (2013.01); *H01L 45/085* (2013.01); *H01L 45/1233* (2013.01); *H01L 45/1253* (2013.01); *H01L 45/14* (2013.01); *H01L 45/141* (2013.01); *H01L 45/146* (2013.01); *H01L 45/147* (2013.01); *H01L 45/148* (2013.01); *H01L 45/16* (2013.01); *H01L 45/1608* (2013.01); *G11C 2013/0071* (2013.01); *G11C 2213/33* (2013.01); *G11C 2213/35* (2013.01); *G11C 2213/52* (2013.01)

(58) Field of Classification Search
USPC .......................................................... 365/148
See application file for complete search history.

(56) References Cited

U.S. PATENT DOCUMENTS

| | | | |
|---|---|---|---|
| 6,946,673 B2 | 9/2005 | Zonca et al. | |
| 8,243,506 B2 | 8/2012 | Liu | |
| 8,399,875 B1 | 3/2013 | Mikawa et al. | |
| 8,642,985 B2 | 2/2014 | Chen et al. | |
| 8,716,780 B2 | 5/2014 | Kellam et al. | |
| 8,723,152 B2 | 5/2014 | Nishi et al. | |
| 8,772,749 B2 | 7/2014 | Sekar et al. | |
| 9,425,390 B2 * | 8/2016 | Wells | H01L 45/04 |
| 9,543,359 B2 | 1/2017 | Lu et al. | |
| 9,721,646 B1 | 8/2017 | Kothandaraman | |
| 10,109,677 B2 * | 10/2018 | Wells | H01L 45/04 |

| | | |
|---|---|---|
| 2009/0298224 A1 | 12/2009 | Lowrey |
| 2010/0091561 A1 | 4/2010 | Lowrey et al. |
| 2012/0195121 A1 | 8/2012 | Torri et al. |
| 2013/0037775 A1 | 2/2013 | Mitani et al. |
| 2013/0069030 A1 | 3/2013 | Wells et al. |
| 2013/0070511 A1 | 3/2013 | Wells et al. |
| 2013/0207068 A1 | 8/2013 | Pellizzer |
| 2014/0254242 A1 | 9/2014 | Siau |

FOREIGN PATENT DOCUMENTS

| | | |
|---|---|---|
| JP | 2013038264 A | 2/2013 |
| JP | 2013510438 A | 3/2013 |
| KR | 20130007571 A | 1/2013 |
| KR | 20140053037 A | 5/2014 |
| WO | 2010058569 A1 | 5/2010 |

OTHER PUBLICATIONS

Notice of Preliminary Rejection from related Korean patent application No. 10-2017-7012844, dated Jun. 15, 2018, 14 pp.
First Office Action from related Chinese patent application No. 201580055872.0, dated Jul. 2, 2018, 24 pp.
International Search Report and Written Opinion from related international application No. PCT/US2015/055060, dated Jan. 22, 2016, 17 pp.
Tritt, "Thermal Conductivity: Theory, Properties and Applications", Kluwer Academic/Plenum Publishers, 2004, 306 pp.
Pop, "Energy Dissipation and Transport in Nonoscale Devices", Nano Research vol. 3, No. 147, Jan. 5, 2010, 20 pp.
Cahill, et al. "Nanoscale Thermal Transport. II. 2003-2012", Applied Physics Reviews vol. 1, No. 011305, Jan. 2014, 45 pp.
Reifenberg, et al. "The Impact of Thermal Boundary Resistance in Phase-Change Memory Devices", IEEE Electro Device Letters, vol. 29, No. 10, Oct. 2008, 3 pp.
Bozorg-Grayeli, et al. "Temperature-Dependent Thermal Properties of Phase-Change Memory Electrode Materials", IEEE Electron Device Letters, vol. 32, No. 9, Sep. 2011, 3 pp.
Office Action from related Taiwanese patent application No. 104134087, dated Mar. 16, 2017, 7 pp.
Office Action from related Taiwanese application No. 104134087, dated Nov. 11, 2016, 18 pp.
Supplementary Search Report from related European patent application No. 15850788.9. dated May 22, 2018, 6 pp.
Second Office Action from related Chinese patent application No. 201580055872.0, dated Apr. 1, 2019, 22 pages.

* cited by examiner

SELECT DEVICE FOR MEMORY CELL APPLICATIONS

PRIORITY INFORMATION

This application is a Continuation of U.S. application Ser. No. 15/665,577 filed Aug. 1, 2017, which is a Continuation of U.S. application Ser. No. 15/215,659 filed Jul. 21, 2016, now U.S. Pat. No. 9,735,200, which is a Divisional of U.S. application Ser. No. 14/515,998 filed Oct. 16, 2014, now U.S. Pat. No. 9,425,390, the specifications of which are incorporated herein by reference.

TECHNICAL FIELD

The present disclosure relates generally to semiconductor memory devices and methods, and more particularly, to select devices for memory cell applications.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

RRAM devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some RRAM cells can be programmed to multiple states such that they can represent, e.g., store, two or more bits of data.

The programmed state of a resistive memory cell may be determined, e.g., read, for example, by sensing current through the selected resistive memory cell responsive to an applied interrogation voltage. The sensed current, which varies based on the resistance level of the memory cell, can indicate the programmed state of the resistive memory cell.

In various instances, arrays of resistive memory cells can be prone to read disturbance problems. For instance, as part of a read operation, current can flow from a selected access line, e.g., word line, through a selected memory cell, to a data/sense line, e.g., bit line. However, in various array architectures such as cross-point architectures, current also flows into unselected word lines that cross over the selected bit line. Conduction of current into unselected word lines can reduce the ability to distinguish between data states, e.g., by decreasing output impedance, among other drawbacks.

BRIEF DESCRIPTION OF THE DRAWINGS

FIG. 3A-1 illustrates a cross-sectional view of a select device in accordance with one or more embodiments of the present disclosure.

FIG. 3B-1 illustrates a top view of the select device illustrated in FIG. 3A-1 in accordance with one or more embodiments of the present disclosure.

FIG. 3A-2 illustrates a cross-sectional view of a select device in accordance with one or more embodiments of the present disclosure.

FIG. 3B-2 illustrates a top view of the select device illustrated in FIG. 3A-2 in accordance with one or more embodiments of the present disclosure

DETAILED DESCRIPTION

Figure 1:
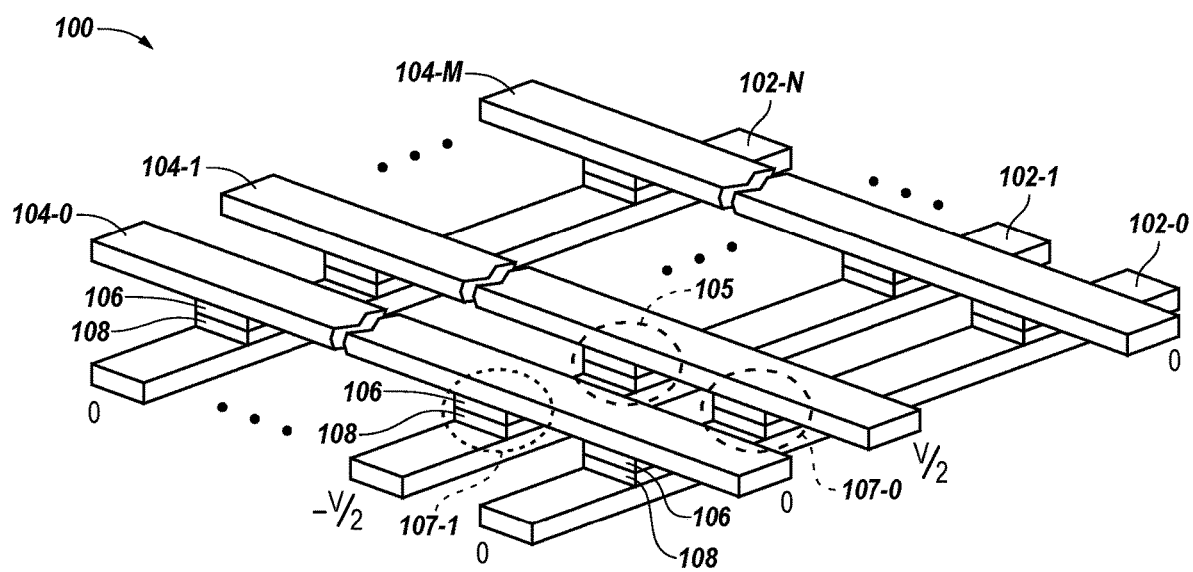
FIG. 1 is a block diagram of a portion of an array of resistive memory cells in accordance with one or more embodiments of the present disclosure.

The present disclosure includes select devices and methods of using select device for memory cell applications. An example select device includes a first electrode having a particular geometry, a semiconductor material formed on the first electrode and a second electrode having the particular geometry with formed on the semiconductor material, wherein the select device is configured to snap between resistive states in response to signals that are applied to the select device.

Embodiments according to the present disclosure can include a select device that snaps between a first resistive state and a second resistive state in response to signals above a threshold voltage being applied to and then removed from the select device. As an example, embodiments of the present disclosure can support current densities greater than 1 $MA/cm^2$ when the select device is in the first resistive state in response to the signal applied to the select device being greater than the threshold voltage. Embodiments of the present disclosure can include benefits such as providing a bi-directional select device useful for memory applications such as resistive memory applications, for instance. As an example, one or more select devices in accordance with the present disclosure can be formed at temperatures sufficiently low to support back end of line processing (BEOL) when forming memory arrays such as RRAM arrays. Various embodiments provide select devices having a high on current versus off current ratio (Ion/Ioff) in association with a partial select read method, such as a half select read method or third select read method. That is, Ion/Ioff at an on voltage (Von) associated with the memory array is much greater than Ion/Ioff at a corresponding half select voltage (Von/2) or third select voltage (Von/3). As an example, Ion/Ioff at Von can be at least $1 \times 10^4$ times greater than the Ion/Ioff at Von/2, in some embodiments. Various embodiments include leakage currents of a select device that scale with the area of a select device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 208 may reference element "08" in FIG. 2A, and a similar element may be referenced as 308 in FIG. 3A. As will be appreciated, elements shown in the various embodiments herein can be added, exchanged, and/or eliminated so as to provide a number of additional embodiments of the present disclosure.

FIG. 1 is a block diagram of a portion of an array 100 of memory cells in accordance with one or more embodiments of the present disclosure. The array 100 is a two terminal cross-point array having memory cells located at the intersections of a number of access lines 102-0, 102-1, ..., 102-N, which may be referred to herein as word lines, and a number of data/sense lines 104-0, 104-1, ..., 104-M, which may be referred to herein as bit lines. As illustrated, the word lines 102-0, 102-1, ..., 102-N are parallel to each other and are orthogonal to the bit lines 104-0, 104-1, ..., 104-M, which are substantially parallel to each other; however, embodiments are not so limited.

Each memory cell may include a storage element 106, e.g. a resistive memory element, coupled in series with a select device 108, e.g., an access device, in accordance with one or more embodiments described herein. The storage element 106 can include a programmable portion that may have a variable resistance, for example. The storage element 106 can include, for example, one or more resistance variable materials such as a transition metal oxide material or a perovskite including two or more metals, e.g., transition metals, alkaline earth metals, and/or rare earth metals. Other examples of resistance variable materials associated with the storage element 106 of a memory cell can include chalcogenides, binary metal oxides, colossal magnetoresistive materials, and/or various polymer-based resistive variable materials, among others. As such, the memory cells can be RRAM cells, PCRAM cells, and/or conductive bridging memory cells, among various other types of resistive memory cells.

In one or more embodiments, the select devices 108 corresponding to each memory cell include a first electrode, a semiconductor material, and a second electrode. The first electrode, the semiconductor material, and the second electrode of the select devices can be configured so that they snap between a first resistive state and a second resistive state when a signal is applied to select device 108. For example, select device 108 can snap from a first resistive state to a second resistive state when a signal that is greater than a threshold voltage is applied to select device 108.

Therefore, when a signal that is greater than the threshold voltage is applied to select device 108, the select device snaps to the second resistive state and a current associated with programming and/or reading a memory cell can pass through the select device to storage element 106. Once the signal is removed from the select device 108, the select device 108 snaps back to the first resistive state. In a number of embodiments, the select device 108 can repeatedly snap between resistive states when a signal is applied to the select device and removed from the select device 108.

In a number of embodiments, select device 108 can be configured so that a first resistive state of the select device does not allow current associated with programming and/or reading a memory cell to pass through the select device 108 to the storage element 106 of a memory cell. Also, select device 108 can be configured so that a second resistive state of the select device allows current associated with programming and/or reading a memory cell to pass through the select device 108 to the storage element 106 of a memory cell. In a number of embodiments, select device 108 can be configured so that a storage element 106 of a memory cell can see a current density of greater than 1 MA/cm$^2$ when the select device 108 is in a resistive state associated with a signal greater than a threshold voltage.

In a number of embodiments, the select device 108 can be configured to snap between resistive states when a signal is applied to the select device 108 based on the size of the select device 108 and the materials comprising the select device 108. For example, the threshold voltage where the snap between resistive states occurs can be configured based on the size of the select device 108 and the materials comprising the select device 108. In a number of embodiments, select device 108 can include a first electrode and a second electrode configured in a circular geometry having a diameter of less than approximately 30 nanometers. The select devices 108 can include a semiconductor material between two electrodes and the semiconductor material and the two electrodes can be doped with an optical adsorber, such as carbon, for example. Also, an insulating material can be formed on the sidewalls of the two electrodes and the semiconductor material. The insulating material can control the heat loss in the semiconductor material so that the select device can have desired resistive properties. For example, doping the electrodes and/or semiconductor material with carbon and/or providing an insulating material on the sidewalls of the electrodes and semiconductor material can provide the select device 108 with thermal properties to reach a temperature where the select device snaps between resistive states when a voltage, such as a programming and/or read signal, is applied to the select device. For example, various thermal, electrical, and structural properties of the select device 108 can be configured so that storage element 106 and select device 108 can be operated together with control circuitry. In a number of embodiments, select device 108 can be configured to operate between approximately 0.1 V to 10V and snap between resistive states with a current that is less than approximately 1 µA. For example, select device 108 reaches a temperature of greater than 600° C. when a signal of 0.5V to 5V, with a corresponding current of approximately 1 nA to 100 nA, is applied to the select device 108. In a number of embodiments, the leakage current of the select device 108 when applying a half select voltage or a third select voltage, for example, can be less than approximately 1 µA. For example, when a half select voltage is applied to select device 108, the leakage current of the select device can be less than approximately 10 nA.

As an example, the array 100 can be operated in accordance with a half select method, e.g., a half select biasing scheme. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines at a reference potential, e.g., a ground potential. In the example illustrated in FIG. 1, memory cell 105 is a selected memory cell. That is, selected memory cell 105 is coupled to a selected bit line 104-1 biased at V/2 and a selected word line 102-1 biased at −V/2. As such, the full select voltage (V) is applied across the selected memory cell 105. The unselected memory cells coupled to the selected bit line 104-1 and selected word line 102-1, e.g., unselected memory cells 107-0 and 107-1, experience a half select voltage of +/−V/2 and can be referred to as "half selected" cells. The unselected memory cells coupled to unselected bit lines and/or word lines are unbiased, e.g., they experience a ground potential of 0V, in this example. The select voltage (V) can be a write voltage or a read voltage, for instance.

It can be beneficial for select devices to provide a half select ratio (HSR) that is as large as possible. The HSR can refer to the ratio of the current flowing through a selected memory cell, e.g., 105, to the current flowing through a half selected memory cell, e.g., 107-0 and 107-1. As described further below, select devices in accordance with one or more embodiments can provide a half select ratio of $10^4$:1 to $10^5$:1 or larger, for example. The larger the HSR, the lower the power dissipation caused by current flow in half-selected memory cells, e.g., 107-0 and 107-1, and the greater the signal to noise ratio (S/N) during read and/or write operations, which can reduce the likelihood of read and/or write disturb to half selected memory cells. The half select method is provided as one example and embodiments are not limited to a particular programming and/or read method.

Embodiments of the present disclosure are not limited to a half select method associated with programming or reading a memory cell. For instance, the array 100 can be operated in accordance with other biasing schemes, such as a one third select method. As an example, a one third select method can include applying a full select voltage (V) to a selected bit line and a ground potential to a selected word line, while biasing unselected bit lines at V/3 and unselected word lines at (2V)/3, such that the voltage between unselected word lines and bit lines is about +/−V/3.

In various embodiments, the select devices 108 corresponding to memory cells of array 100 can be "bipolar" in that they permit bi-directional current flow, e.g., in both forward and reverse directions, under sufficiently high voltage bias conditions, but block current flow under lower voltage conditions.

Figure 2A:
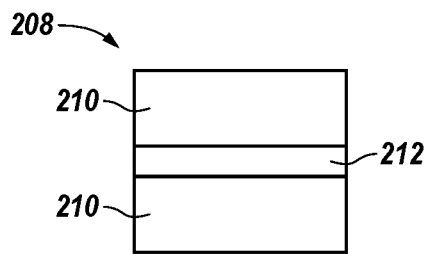
FIG. 2A illustrates a cross-sectional view of a select device in accordance with one or more embodiments of the present disclosure.

FIG. 2A illustrates a cross-sectional view of a select device 208 in accordance with one or more embodiments of the present disclosure. In FIG. 2A, select device 208 includes electrodes 210 and a semiconductor material 212. In a number of embodiments, electrodes 210 can include material such as titanium silicon nitride (TiSiN), tantalum nitride (TaN), and/or carbon, for example. In a number of embodiments, electrodes 210 can include a metal doped with carbon. Also, electrodes 210 can include number of portions, such as a laminate formed of portions of a metal, portions of a resistor, and/or portions of a semiconductor. The electrodes 210 can include portions of a semiconductor that can include silicon (Si), silicon germanium (SiGe), germanium (Ge), silicon carbon (SiC), aluminum nitride (AlN), carbon, and/or diamond like carbon (DLC), among other semiconductors. The portions of semiconductors included in the electrodes 210 can be doped with a metal. The semiconductors can be doped with approximately $1E14^3$ atoms of the dopant metal, for example. A semiconductor portion included in the electrodes 210 can be approximately 5 nm-50 nm thick.

In a number of embodiments, the electrodes can include a number of portions of material that interface with the semiconductor material 212. The number of materials can include combination of materials that interface and can act as a thermal boundary resistance, which can limit heat dissipation through the electrodes 210 to the semiconductor material 212. The portions of materials can be formed of a number of portions of materials interfacing together that include tungsten/carbon (W/C), tungsten silicon/carbon (WSi$_x$/C), tungsten nitride/carbon (WN/C), titanium/carbon (Ti/C), tungsten/silicon carbide (W/SiC), tungsten/doped polycrystalline semiconductor, tungsten silicon/doped polycrystalline semiconductor, and/or tungsten nitride/dope polycrystalline semiconductor, among other material combinations. For example, the polycrystalline semiconductors can be silicon (Si), silicon germanium (SiGe), germanium (Ge), silicon carbide (SiC), and/or aluminum nitride (AlN) doped with arsenic (As), boron (B), phosphorus (P), titanium (Ti), aluminum (Al), antimony (Sb), tin (Sn), indium (In), and/or bismuth (Bi), among other materials. Also, a portion of carbon (C) or tungsten silicon (WSi$_x$) can be formed between the electrodes 210 and the semiconductor material 212. The portion of carbon (C) or tungsten silicon (WSi$_x$) can be approximately 1 nm-30 nm thick and can help prevent metal electro-migration between the electrodes 210 and the semiconductor material 212.

In a number of embodiments, semiconductor material 212 can include amorphous silicon. Also, the amorphous silicon can be doped with carbon to increase the thermal capacitance of the semiconductor material 212. The semiconductor material 212 can be configured so that the resistive state changes in response to the semiconductor material 212 heating to a temperature of greater than 600° C. when a signal that is between 0.5V and 5V is applied to the select device 208.

Figure 2B:
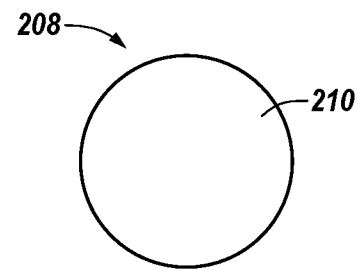
FIG. 2B illustrates a top view of the select device illustrated in FIG. 2A in accordance with one or more embodiments of the present disclosure.

FIG. 2B illustrates a top view of the select device 208 illustrated in FIG. 2A in accordance with one or more embodiments of the present disclosure. As illustrated in FIG. 2B, select device 208 can have a circular geometry. The electrodes 210 of select device can have a diameter of approximately 100 nanometers or less. The semiconductor material 212, not shown in FIG. 2B, can have the same circular geometry as the electrodes. In a number of embodiments, the select device 208 and the electrodes 210 can have an aspect ratio that is greater than 10. The select device and the electrodes 210 having such aspect ratios can increase the thermal resistance of the select device and reduce thermal sink effects in the select device. In a number of embodiments, the semiconductor material 212 can have a different geometry and/or size than electrodes 210. For example, the semiconductor material 212 could have a diameter that is less than the diameter of the electrodes 210. In a number of embodiments, the electrodes 210 and/or semiconductor material 212 can have a quasi-square geometry, among other geometries. In a number of embodiments, a vacuum can be formed between adjacent select devices. A vacuum between adjacent select devices can provide thermal insulation, which can to reduce the thermal effects on a particular select device when heating and/or cooling adjacent select devices.

Figures 1, 3A:
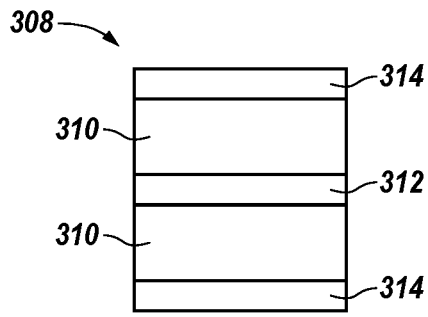

FIG. 3A-1 illustrates a cross-sectional view of a select device 308 in accordance with one or more embodiments of the present disclosure. In FIG. 3A-1, select device 308 includes heaters 314, electrodes 310 and a semiconductor material 312. In a number of embodiments heaters 314 can be in contact with the electrodes 310. The heaters 314 can be formed of metals and/or carbon, among other materials that can increase the thermal capacitance of the select device 308. In a number of embodiments, electrodes 310 can include materials such as titanium silicon nitride (TiSiN), tantalum nitride (TaN), and/or carbon, for example. In a number of embodiments, electrodes 310 can include a metal doped with carbon. Also, electrodes 310 can include a laminate formed of portions of a metal and portions of a resistor. In a number of embodiments, semiconductor material 312 can include amorphous silicon. Also, the amorphous silicon can be doped with carbon to increase the thermal capacitance of the semiconductor material 312.

Figures 1, 3B:
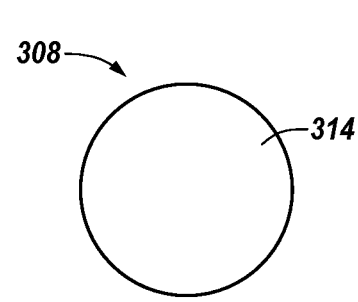

FIG. 3B-1 illustrates a top view of the select device 308 illustrated in FIG. 3A-1 in accordance with one or more embodiments of the present disclosure. As illustrated in FIG. 3B-1, select device 308 can have a circular geometry. The heaters 314 and electrodes 310, not shown in FIG. 3B-1, of select device 308 can have a diameter of approximately 30 nanometers or less. The semiconductor material 312, not shown in FIG. 3B-1, can have the same circular geometry as the electrodes. In a number of embodiments, the semiconductor material 312 can have a different geometry and/or size than electrodes 310 and/or heaters 314. For example, the semiconductor material 312 could have a diameter that is less than the diameter of the electrodes 310 and/or heaters 314. In a number of embodiments, the electrodes 310, heaters 314, and/or semiconductor material 312 can have a quasi-square geometry, among other geometries.

Figures 2, 3A:
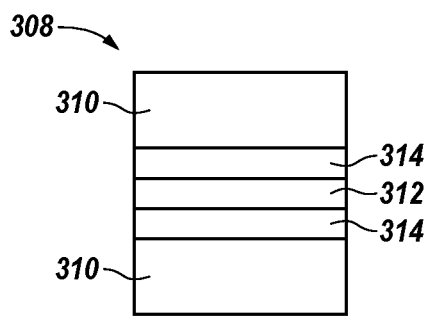
Figures 2, 3B:
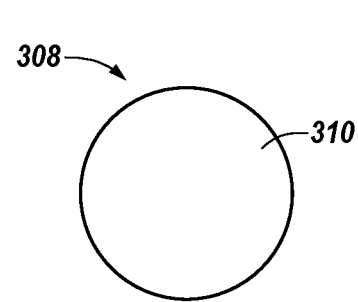

FIG. 3A-2 illustrates a cross-sectional view of a select device 308 in accordance with one or more embodiments of the present disclosure. In FIG. 3A-2, select device 308 includes electrodes 310, heaters 314, and a semiconductor material 312. In a number of embodiments, electrodes 310 can be in contact with the heaters 314. In a number of embodiments, electrodes 310 can include materials such as titanium silicon nitride (TiSiN), tantalum nitride (TaN), and/or carbon, for example. In a number of embodiments, electrodes 310 can include a metal doped with carbon. Also, electrodes 310 can include a laminate formed of portions of a metal and portions of a resistor. The heaters 314 can be formed of metals and/or carbon, among other materials that can increase the thermal capacitance of the select device 308. In a number of embodiments, semiconductor material 312 can include amorphous silicon. Also, the amorphous silicon can be doped with carbon to increase the thermal capacitance of the semiconductor material 312.

FIG. 3B-2 illustrates a top view of the select device 308 illustrated in FIG. 3A-2 in accordance with one or more embodiments of the present disclosure. As illustrated in FIG. 3B-2, select device 308 can have a circular geometry. The electrodes 310 and the heaters 314, not shown in FIG. 3B-2, of select device 308 can have a diameter of approximately 30 nanometers or less. The semiconductor material 312, not shown in FIG. 3B-2, can have the same circular geometry as the electrodes. In a number of embodiments, the semiconductor material 312 can have a different geometry and/or size than electrodes 310 and/or heaters 314. For example, the semiconductor material 312 could have a diameter that is less than the diameter of the electrodes 310 and/or heaters 314. In a number of embodiments, the electrodes 310, heaters 314 and/or semiconductor material 312 can have a quasi-square geometry, among other geometries.

Figure 4A:
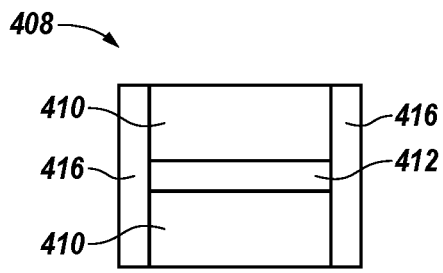
FIG. 4A illustrates a cross-sectional view of a select device in accordance with one or more embodiments of the present disclosure.

FIG. 4A illustrates a cross-sectional view of a select device 408 in accordance with one or more embodiments of the present disclosure. In FIG. 4A, select device 408 includes electrodes 410, a semiconductor material 412, and an insulating material 416. In a number of embodiments, electrodes 410 can include material such as titanium silicon nitride (TiSiN), tantalum nitride (TaN), and/or carbon, for example. In a number of embodiments, electrodes 410 can include a metal doped with carbon. Also, electrodes 410 can include a laminate formed of portions of a metal and portions of a resistor.

In a number of embodiments, semiconductor material 412 can include amorphous silicon. Also, the amorphous silicon can be doped with carbon to increase the thermal capacitance of the semiconductor material 412. The insulating material 416 can be formed on the sidewalls of the electrodes 410 and the semiconductor material 412. The insulating material 416 can include silicon dioxide ($SiO_2$), silicon nitride (SiN), boron nitride (BN), aluminum oxide ($Al_2O_3$), hafnium oxide ($HfO_2$), hafnium oxide ($HfO_2$) doped with less than 50% yttrium oxide ($Y_2O_3$), zirconium oxide ($ZrO_2$), zirconium oxide ($ZrO_2$) doped with between 4% and 8% yttrium oxide ($Y_2O_3$), yttrium oxide ($Y_2O_3$), titanium oxide ($TiO_2$), yttria-stabilized zirconia (YSZ), and/or pyrochlore oxides, for example, among other insulating materials. The insulating material 416 can provide thermal insulation to allow the semiconductor material to heat to a temperature where a resistive state of the semiconductor material snaps to a different resistive state. In a number of embodiments, insulating material can be formed so that there is a vacuum between the insulating material and the sidewalls of the semiconductor material and the electrode material. The vacuum between the insulating material and the sidewalls of the semiconductor material and the electrode material can provide thermal insulation to facilitate the heating and/or cooling of the semiconductor material.

Figure 4B:
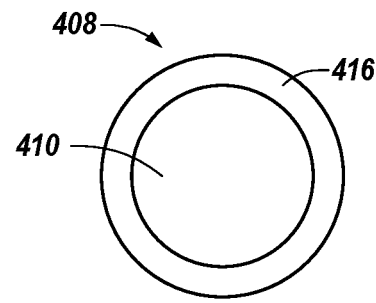
FIG. 4B illustrates a top view of the select device illustrated in FIG. 4A in accordance with one or more embodiments of the present disclosure.

FIG. 4B illustrates a top view of the select device 408 illustrated in FIG. 4A in accordance with one or more embodiments of the present disclosure. As illustrated in FIG. 4B, select device 408 can have a circular geometry. The insulating material 416 and electrodes 410 of select device 408 can have a combined diameter of approximately 30 nanometers or less. The semiconductor material 412, not shown in FIG. 4B, can have the same circular geometry as the electrodes. In a number of embodiments, the semiconductor material 412 can have a different geometry and/or size than insulating material 416 and electrodes 410. For example, the semiconductor material 412 could have a diameter that is less than the diameter of the insulating material 416 and electrodes 410. In a number of embodiments, the electrodes 410, insulating material 416, and/or semiconductor material 412 can have a quasi-square geometry, among other geometries.

Figure 5:
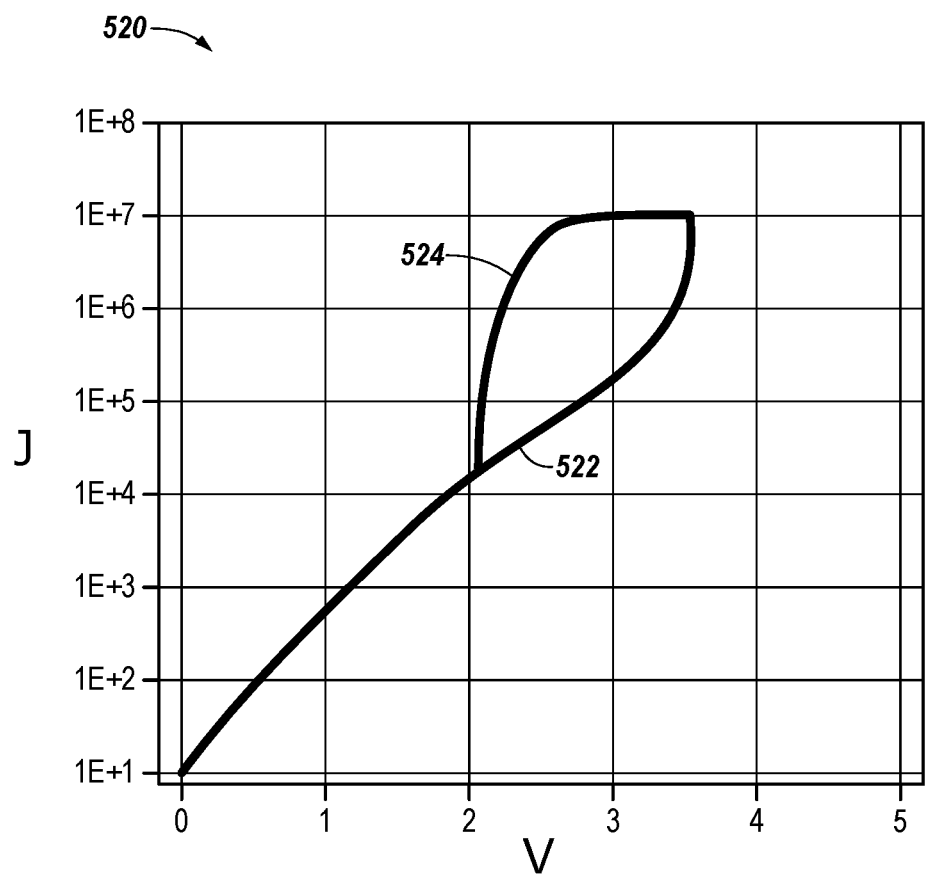
FIG. 5 is a graph illustrating voltage and current relationships of a select device in accordance with one or more embodiments of the present disclosure.

FIG. 5 is a graph illustrating voltage and current density relationships, e.g., a JV graph, of a select device in accordance with one or more embodiments of the present disclosure. In FIG. 5, JV graph 520 includes line 522 that illustrates the relationship of the current density on a select device, such as select devices 108, 208, 308, 408 described in association with FIGS. 1-4, when a signal, such a programming signal and/or a read signal, is applied to the select device.

In one or more embodiments, when a signal, e.g., a first signal, having a voltage that ramps from approximately 0 V to approximately 3.2 V, the current density on the select device starts to increase significantly once the signal reaches a threshold voltage, which is approximately 3.2 V on graph 520. For example, the current density on the select device ranges from approximately 1E1 A/cm$^2$ to 1E5 A/cm$^2$, when the signal is ramped from approximately 0 V to 3.5 V, while the current density on the select device ranges from approximately 1E5 A/cm$^2$ to 2E7 A/cm$^2$, when the signal is ramped from approximately 3.2 V to 3.5 V. The current corresponding to the voltage ranging from 0V to 3.2 V can range from approximately 1E-10V to approximately 1E-4 V. The increase of the current density on the select device is caused by a drop in resistance of the select device due to the signal heating the select device having the materials and geometry described herein. The select devices described herein can withstand repeated heating to temperatures greater than 600° C. without breaking down. For example, applying a signal that is ramped from 0 V to 3.5 V causes the select device heat up. When the select device reaches a threshold temperature ($T_T$) due to the voltage of the signal applied to the select device increasing, the select device snaps between resistive states and the resistance of select device decreases by a number of orders of magnitude. FIG. 5 illustrates a select device that is configured to reach a threshold temperature, where the select device snaps between resistive states, which is greater than 600° C. when a signal that is greater than or equal to approximately 3.2 V is applied to the select device. Once the select device snaps between resistive states and the resistance of the select device decreases, the signal is passed from the select device to a storage element of a memory cell with a magnitude of current that is sufficient to program and/or read the memory cells.

In FIG. 5, graph 520 includes line 524 that illustrates the relationship of the current density on a select device, such as select devices 108, 208, 308, 408 described in association with FIGS. 1-4, when a signal, such a programming signal and/or a read signal, is removed from the select device.

In one or more embodiments, line 524 on graph 520 illustrates as a signal, e.g., a first signal, having a voltage of approximately 3.5V is removed from the select device causing the voltage on the select device to decrease. As the voltage on the select device decreases, the temperature of select device decreases, which causes the resistance of the select device to increase and also the current density on the select device to decrease. In FIG. 5, as the signal is removed from select device, the current density on the select device decreases from approximately 2E7 A/cm$^2$ to 1E4 A/cm$^2$, as the voltage of the signal decreases from approximately 3.5V to 2V. While the current density on the select device decreases from approximately 1E4 A/cm$^2$ to 1E1 A/cm$^2$, as the voltage of the signal decreases from approximately 2V to 0V. The decrease in current density on the select device that starts when the voltage on the select device is approximately 2V can correspond with the temperature of the select device cooling to below a threshold temperature, where the select device snaps between resistance states. For example, the resistance of the select device can snap from a second resistance state to a first resistance state, where the first resistance state is a number of orders of magnitude higher than the second resistance state, when the select device cools to below the threshold temperature. In a number of embodiments, the select device can snap between resistive states less than 15 ns after a signal is removed from the select device. Once the select device snaps between resistive states and the resistance of the select device increases, the select device is in a resistive state where signals, e.g., a second signal, applied to the select device that are less than a threshold voltage do not pass from the select device to a storage element of a memory cell with a magnitude of current that is sufficient to program and/or read the memory cells.

The present disclosure includes select devices and methods of using select device for memory cell applications. An example select device includes a first electrode having a particular geometry, a semiconductor material formed on the first electrode and a second electrode having the particular geometry with formed on the semiconductor material, wherein the select device is configured to snap between resistive states in response to signals that are applied to the select device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
   a select device including:
   a first electrode having a particular geometry;
   a first heater formed on the first electrode;
   a semiconductor material formed on the first heater;
   a second heater formed on the semiconductor material; and
   a second electrode having the particular geometry formed on the second heater; and
   a storage element coupled in series to the select device.

2. The memory cell of claim 1, wherein a width of the semiconductor material is less than approximately 20 nanometers.

3. The memory cell of claim 1, wherein a width of the particular geometry is based on an operating voltage associated with the memory cell.

4. The memory cell of claim 1, wherein a composition of the semiconductor material is based on an operating voltage associated with the memory cell.

5. The memory cell of claim 1, wherein the select device is configured to support bi-directional current flow therethrough.

6. The memory cell of claim 1, wherein the particular geometry is a circular geometry.

7. The memory cell of claim 1, wherein the particular geometry is a quasi-square geometry.

8. A memory cell, comprising:
   a select device including:
      a first heater;
      a first electrode on the first heater;
      a semiconductor material on the first electrode;
      a second electrode on the semiconductor material; and
      a second heater on the second electrode; and
   a storage element coupled in series to the select device.

9. The memory cell of claim 8, wherein a vacuum is between the select device and an adjacent select device of an array.

10. The memory cell of claim 8, wherein the first and second electrodes include an optical absorber.

11. The memory cell of claim 8, wherein first electrode includes a first laminate portion that includes a metal and a resistive material.

12. The memory cell of claim 8, wherein the first heater is a metal.

13. A memory cell, comprising:
    a select device including:
       a first electrode and a second electrode;
       a first heater and a second heater, wherein the first heater is coupled to the first electrode and the second heater is coupled to the second electrode; and
       a semiconductor material between the first and second electrodes, wherein the first heater and first electrode are adjacent to a first surface of the semiconductor material and the second heater and second electrode are adjacent to a second surface of the semiconductor material; and
    a storage element coupled in series to the select device.

14. The memory cell of claim 13, wherein the select device is configured to:
    snap from a first resistive state to a second resistive state in response to providing a first signal provided thereto, wherein the first signal is greater than a threshold voltage; and
    remain in the first resistive state in response to a second signal provided thereto, wherein the second signal is less than the threshold voltage.

15. The memory cell of claim 14, wherein a first current density is provided to the storage element in response to the select device snapping from the first resistive state to the second resistive state; and
    a second current density is provided to the storage element in response to the select device remaining in the first resistive state.

16. The memory cell of claim 15, wherein the first current density is greater than 1 $MA/cm^2$ and the second current density is less than or equal to 1 $MA/cm^2$.

17. The memory cell of claim 14, wherein the select device is configured to snap from the second resistive state to the first resistive state in response to removing the first signal.

18. The memory cell of claim 13, wherein the method includes forming the select device such that the select device reaches a temperature greater than 600° C. in response to providing the first signal to the select device.

19. The memory cell of claim 13, wherein the select device is configured to:
    snap from a first resistive state to a second resistive state in response to reaching a threshold temperature greater than 600° C.; and
    the select device is configured to repeatedly reach the threshold temperature.

20. The memory cell of claim 14, wherein the threshold voltage is approximately 2.5 V.

* * * * *